US009720059B2

United States Patent
Lin et al.

(10) Patent No.: US 9,720,059 B2
(45) Date of Patent: Aug. 1, 2017

(54) MULTI-CHANNEL COIL ARRAY FOR PARALLEL MAGNETIC RESONANCE IMAGING

(71) Applicant: National Taiwan University, Taipei (TW)

(72) Inventors: Fa-Hsuan Lin, Taipei (TW); Ying-Hua Chu, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 694 days.

(21) Appl. No.: 13/855,841

(22) Filed: Apr. 3, 2013

(65) Prior Publication Data

US 2014/0300360 A1    Oct. 9, 2014

(51) Int. Cl.
*G01R 33/3415* (2006.01)
*G01R 33/36* (2006.01)
*G01R 33/48* (2006.01)
*G01R 33/561* (2006.01)

(52) U.S. Cl.
CPC ...... *G01R 33/3415* (2013.01); *G01R 33/3657* (2013.01); *G01R 33/4824* (2013.01); *G01R 33/5611* (2013.01)

(58) Field of Classification Search
USPC .......................... 324/300–322; 600/407–435; 382/128–131
See application file for complete search history.

(56) References Cited

U.S. PATENT DOCUMENTS

| | | | | |
|---|---|---|---|---|
| 7,084,629 B2* | 8/2006 | Monski, Jr. | ...... | G01R 33/34046 324/318 |
| 7,382,130 B2* | 6/2008 | Miyauchi | ............. | G01R 33/341 324/318 |
| 7,642,781 B2* | 1/2010 | Ballon | ............. | G01R 33/34046 324/318 |
| 7,663,367 B2* | 2/2010 | Wiggins | ................ | A61B 5/055 324/309 |
| 7,911,209 B2* | 3/2011 | Alradady | ......... | G01R 33/34076 324/309 |
| 8,148,986 B2* | 4/2012 | Driesel | ............ | G01R 33/34046 324/300 |
| 2005/0099179 A1* | 5/2005 | Monski, Jr. | ...... | G01R 33/34046 324/318 |

(Continued)

OTHER PUBLICATIONS

Ying-Hua Chu, Boris Keil, Wei-Chao Chen, Wen-Jui Kuo, Fa-Hsuan Lin; A 32-channel head coil array with circularly symmetric geometry for 2D accelerated 3D human brain imaging; Conference Paper; May 7, 2012; Proc. Intl. Soc. Mag. Reson. Med. 20 (2012).

*Primary Examiner* — Melissa Koval
*Assistant Examiner* — Tiffany Fetzner
(74) *Attorney, Agent, or Firm* — Bacon & Thomas, PLLC (57) ABSTRACT

This disclosure provides a coil array for parallel magnetic resonance imaging data acquisition, comprising: a plurality of coil elements, wherein each of the coil elements is formed by a loop of wire, wherein the plurality of coil elements are arranged such that the coil elements are covering the imaged sample and uniformly distributed over a plane comprising the encoding directions not in parallel with the frequency encoding directions, which are the directions of the static magnetic field variation generated by a plurality of gradient coils of a magnetic resonance imaging system during magnetic resonance data sampling.

12 Claims, 9 Drawing Sheets

(56) References Cited

U.S. PATENT DOCUMENTS

| | | | |
|---|---|---|---|
| 2006/0244448 A1* | 11/2006 | Ballon | G01R 33/34046 324/318 |
| 2008/0007250 A1* | 1/2008 | Wiggins | A61B 5/055 324/200 |
| 2008/0275332 A1* | 11/2008 | Alradady | G01R 33/34076 600/422 |
| 2009/0096553 A1* | 4/2009 | Driesel | G01R 33/34046 333/219 |
| 2010/0219834 A1* | 9/2010 | Luedeke | G01R 33/34076 324/318 |
| 2014/0300360 A1* | 10/2014 | Lin | G01R 33/3415 324/318 |

* cited by examiner

MULTI-CHANNEL COIL ARRAY FOR PARALLEL MAGNETIC RESONANCE IMAGING

TECHNICAL FIELD

The present disclosure relates to a multi-channel coil array for magnetic resonance imaging, and more particularly, to a multi-channel coil array designed with the considerations of coil locations and k-space trajectory used for magnetic resonance imaging data acquisition.

BACKGROUND

The quality of magnetic resonance imaging (MRI) critically depends on the radio-frequency (RF) receiver coils. While volume coils and surface coils provide a large field-of-view (FOV) and high signal-to-noise ratio (SNR) respectively, a coil array has been introduced to achieve both appealing features simultaneously by using carefully arranged surface coils and low-noise pre-amplifiers. The high SNR offered by a coil array can also be traded-off for spatiotemporal resolution enhancement using parallel MRI (pMRI) methods, where different spatial sensitivity among channels of a coil array is used to estimate the skipped k-space data in acquisition by either an image domain or a k-space reconstruction algorithm. While there are versatile choices of reconstruction methods, the quality of the final reconstructed pMRI is still predominantly affected by the performance of an RF coil array.

One way to optimize the coil array in order to achieve high spatiotemporal resolution of pMRI is increasing the number of channels. Without reaching the theoretical limit, increasing the channel of an RF coil array can improve the condition of the imaging encoding matrix targeted at a specific spatiotemporal resolution enhancement rate. To this end, dense coil arrays for head imaging consisting of 16, 32, 64, and 90 elements have been constructed. There is also a cardiac array using up to 128 receiver channels. The other approach to optimize the RF coil array design is to tailor its geometry to closely fit the imaging object such that the SNR can be maximized. This principle has been recently realized in, for example, a 32-channel lung array, an 8-channel wrist array, and 32-channel head coil arrays for pediatric imaging. Independently, it has also been suggested that surface coils separated by a gap between them instead of overlapping neighboring ones can improve the quality of acquired data. Another issue of the coil array design regarding accelerated imaging is aliasing artifact; a coil array arranged to provide the most disparate spatial information from RF coil sensitivities about the aliased image voxels in accelerated scans is expected to maximally suppress the aliasing artifacts due to sub-Nyquist sampling. Following this rationale, a linear array with up to 64 elements has been used to reconstruct a two-dimensional image from the single-echo acquisition.

In order to achieve the optimal performance of pMRI, the design of the locations and orientations of coil elements in an array should consider the acquisition slice/volume orientation and the k-space trajectory, particularly the phase/partition encoding directions in 2D/3D imaging respectively. With these considerations, a coil array can generate images with better SNR and less aliasing artifacts, and the spatial encoding efficiency can be enhanced. However, coil arrays designed today lack considerations for the above-mentioned aspects.

SUMMARY

The present disclosure provides a coil array for magnetic resonance imaging data acquisition, comprising: a plurality of coil elements, wherein the plurality of coil elements are arranged such that the coil elements are covering the imaged sample and uniformly distributed over a plane comprising the encoding directions not in parallel with the frequency encoding directions, which are the directions of the static magnetic field variation generated by a plurality of gradient coils of a magnetic resonance imaging system during magnetic resonance data sampling. Such a coil array can maximize the spatial encoding efficiency in acquisition; therefore, a higher accelerated rate can be achieved while the image quality is maintained.

In another aspect, the present disclosure provides a coil array for parallel magnetic resonance imaging data acquisition; the coil array comprises a plurality of coil elements, wherein the plurality of coil elements are arranged such that the coil elements are covering the imaged sample and uniformly distributed over a curve comprising the encoding direction not in parallel with the frequency encoding direction, which are the directions of the static magnetic field variation generated by a plurality of gradient coils of a magnetic resonance imaging system during magnetic resonance data sampling.

DETAILED DESCRIPTION OF THE DISCLOSURE

The detailed embodiment accompanied with the drawings illustrates the present disclosure. It is to be noted that the embodiment of the present disclosure is exemplary and the present invention is not limited to the embodiment. The embodiment provided makes the disclosure of this invention complete and clear; therefore, those skilled in the related art can make and use this invention.

In the first embodiment, a circularly symmetric (CS) coil array consisting of 32 channels for head imaging is used to compare the performance of a CS array with a soccer ball (SB) array (a commercial 32-channel head coil array (Siemens, Erlange, Germany)), whose coil elements are arranged similar to a soccer ball. The front view of the CS coil array is given in FIG. 1A. The CS coil array consists of 32 coils distributed over a head helmet 100 with a 18.5 cm diameter. Each RF coil 101 has a long trapezoidal shape and is curved to fit the head helmet from the vertex of the helmet toward the inferior direction. The neighboring RF coils are overlapped to minimize the mutual inductance and thus to decouple the nearest neighboring RF coils. FIG. 1B gives the top view of the CS coil array; from the top view, the RF coils 101 tessellats the helmet 100 in circular symmetry. The width of each RF coil is 3 cm at the inferior end and 1 cm at the vertex of the head. To allow presenting visual simulation in future functional MRI experiments, the anterior coils 101B are shorter in order to avoid obscuring the view of the subject. To increase the quality factor (Q) and to decrease radiating the electromagnetic energy, it has been suggested that the length of coil wire should not exceed $\frac{1}{20}$ of the wavelength. The length of the RF coil 101 is either 14 or 21 cm. There are ten short RF coils 101B and twenty-two long RF coils 101A. Due to the circularly symmetric arrangement of the coils, it is called a "circularly symmetric" (CS) array in this work.

Figure 1A:
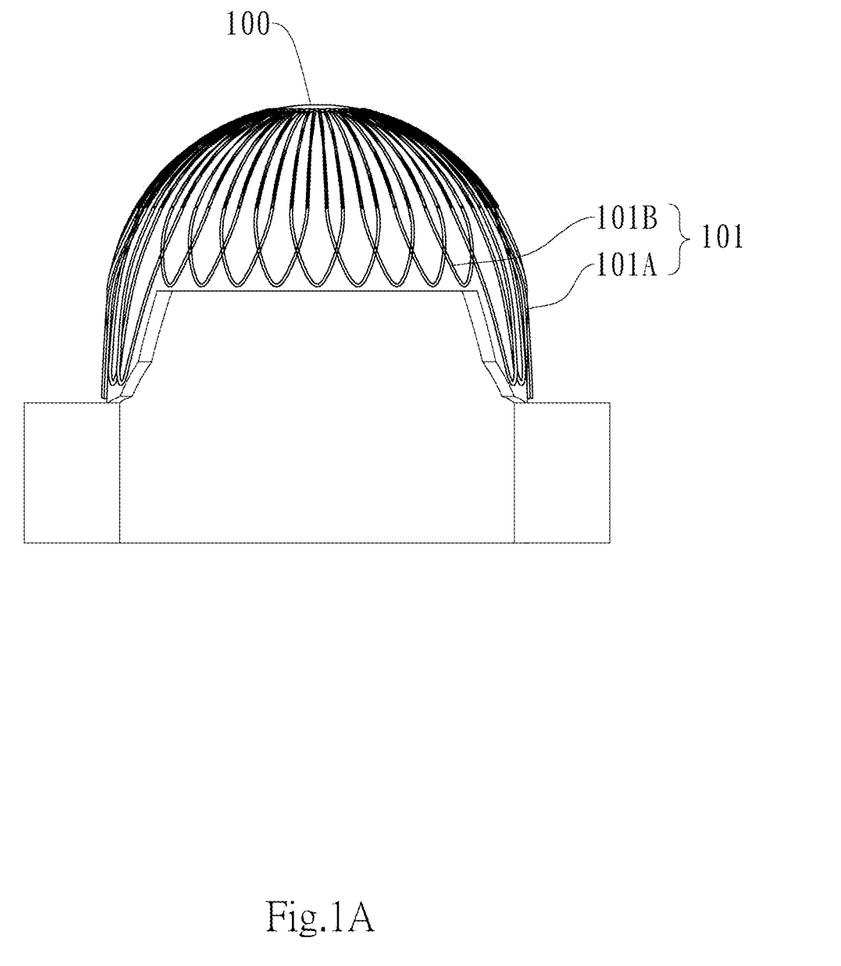
FIG. 1A shows the front view of the circularly symmetric (CS) coil array in accordance with the first embodiment of the present disclosure, wherein the coil elements are distributed over a head helmet.
Figure 1B:
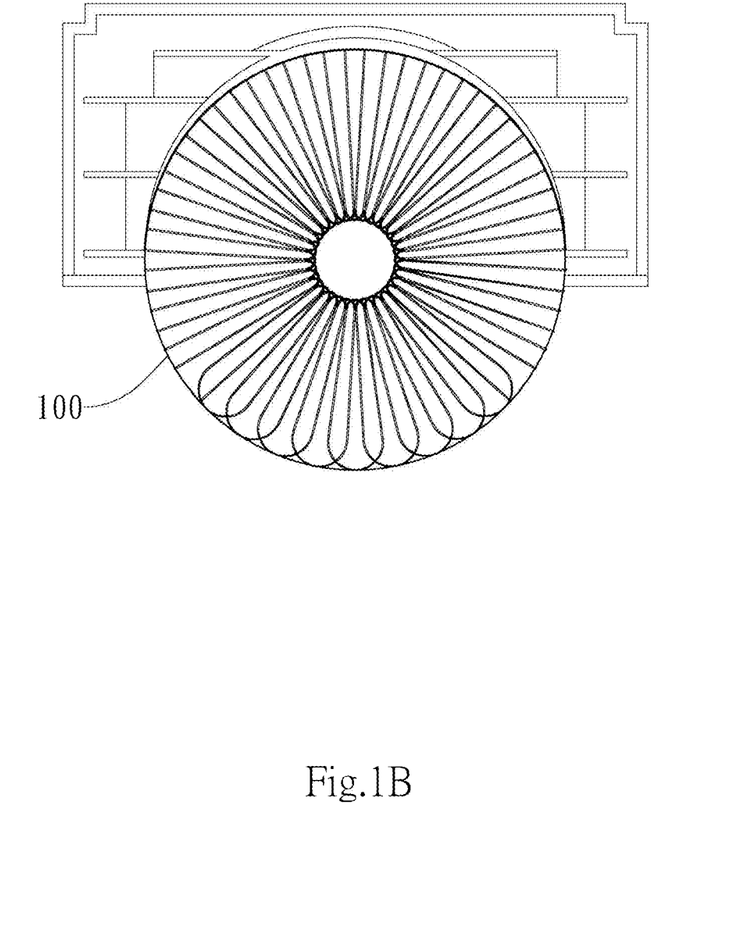
FIG. 1B shows the top view of the CS coil array in accordance with the first embodiment of the present disclosure, wherein the coil elements are distributed over a head helmet.

From FIG. 1A, it is obvious that a transverse plane could intersect all the coil elements in the CS coil array, if the anterior part of the helmet void of coil elements is not taken into consideration. To image a tissue slice lying in such a transverse plane, the number of the coil elements covering the field of view is maximized, and a better spatial encoding efficiency in acquisition is expected. The intersections of the CS coil array and the transverse plane form a circular contour on a plane, which is constructed by the distribution of multiple frequency encoded read-outs in a radial or a spiral k-space trajectory; therefore, it is expected that image data acquired by the CS coil array will have better spatial encoding efficiency if a radial or a spiral k-space trajectory is used.

Figure 2A:
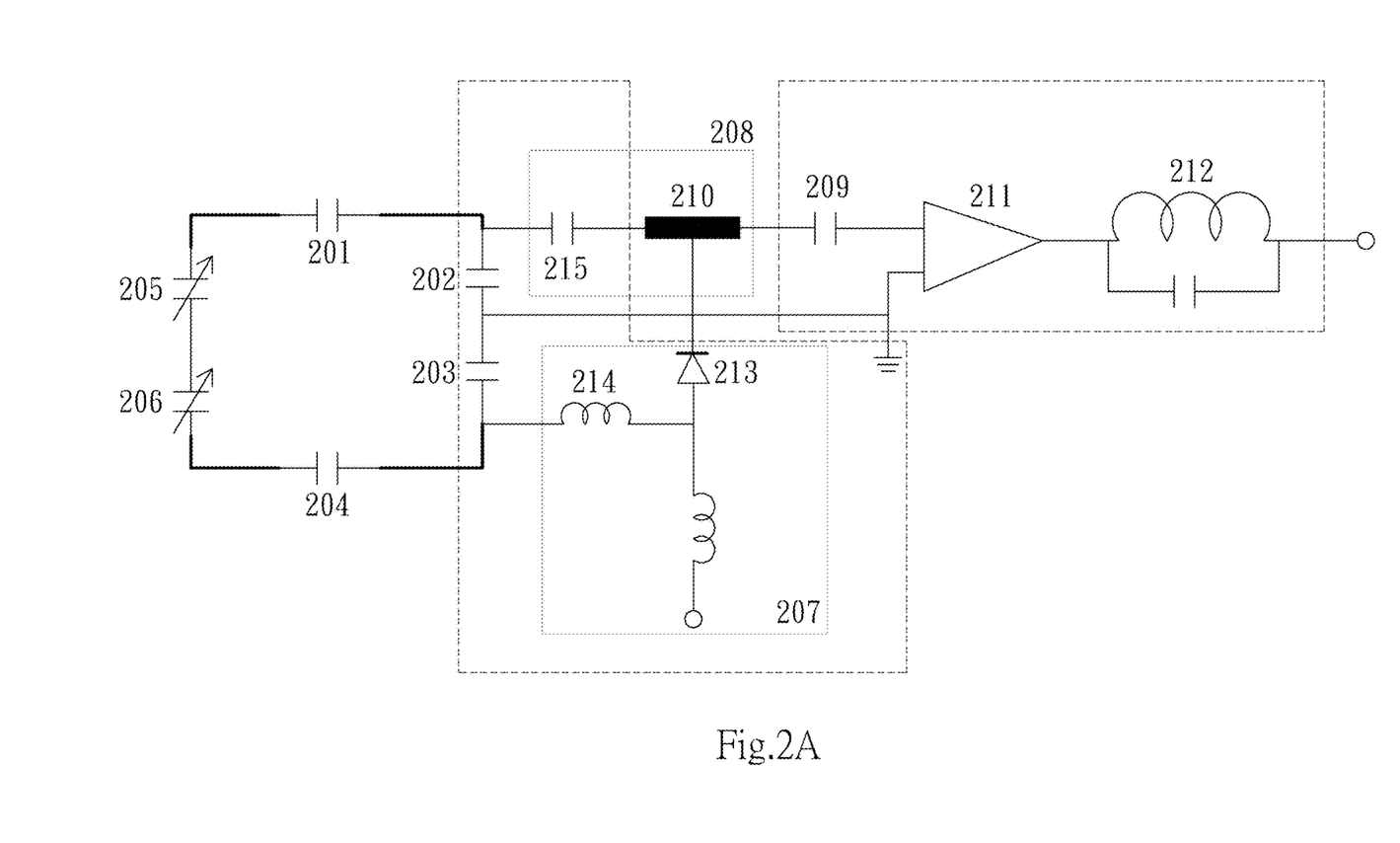
FIG. 2A shows the detailed circuit of the short RF coil.

The detailed circuit of the short RF coil is given in FIG. 2A; the short RF coils are constructed with four distributed non-magnetic capacitors 201, 202, 203, 204 and two variable capacitors 205, 206 for resonance frequency tuning. The balanced circuit design is used in order to reduce the frequency shift under loading and to increase the Q. The coil wire is 16 AWG tinned-copper wire. A 9×13 mm FR4 front-end circuit board consisting of a detuning network 207, and a matching network 208 is connected to capacitors 203 and 202. A DC block 209 is connected between the 45-mm semi-rigid cable 210 and a low noise pre-amplifier 211. The output terminal of the low noise pre-amplifier 211 is connected to a cable trap 212 to ensure a low noise figure by suppressing the common mode current. The cable trap 212 generates a high impedance circuit for cable braid currents and is constructed by a hand-wound loop and a capacitor tuned at the Larmor frequency. During RF transmission, the PIN diode 213 is forward biased and the parallel LC circuit formed by the capacitor 203 and inductor 214 is resonant at the Larmor frequency and exhibited high impedance. Thus this parallel resonance circuit blocks the current flow in coil and detunes the coil during RF transmission. In the matching network 208, both the matching capacitor 215 and the semi-rigid cable 210 transform the loaded coil impedance to 50Ω in order to achieve the optimal noise figure matching for the low noise pre-amplifier 211.

Figure 2B:
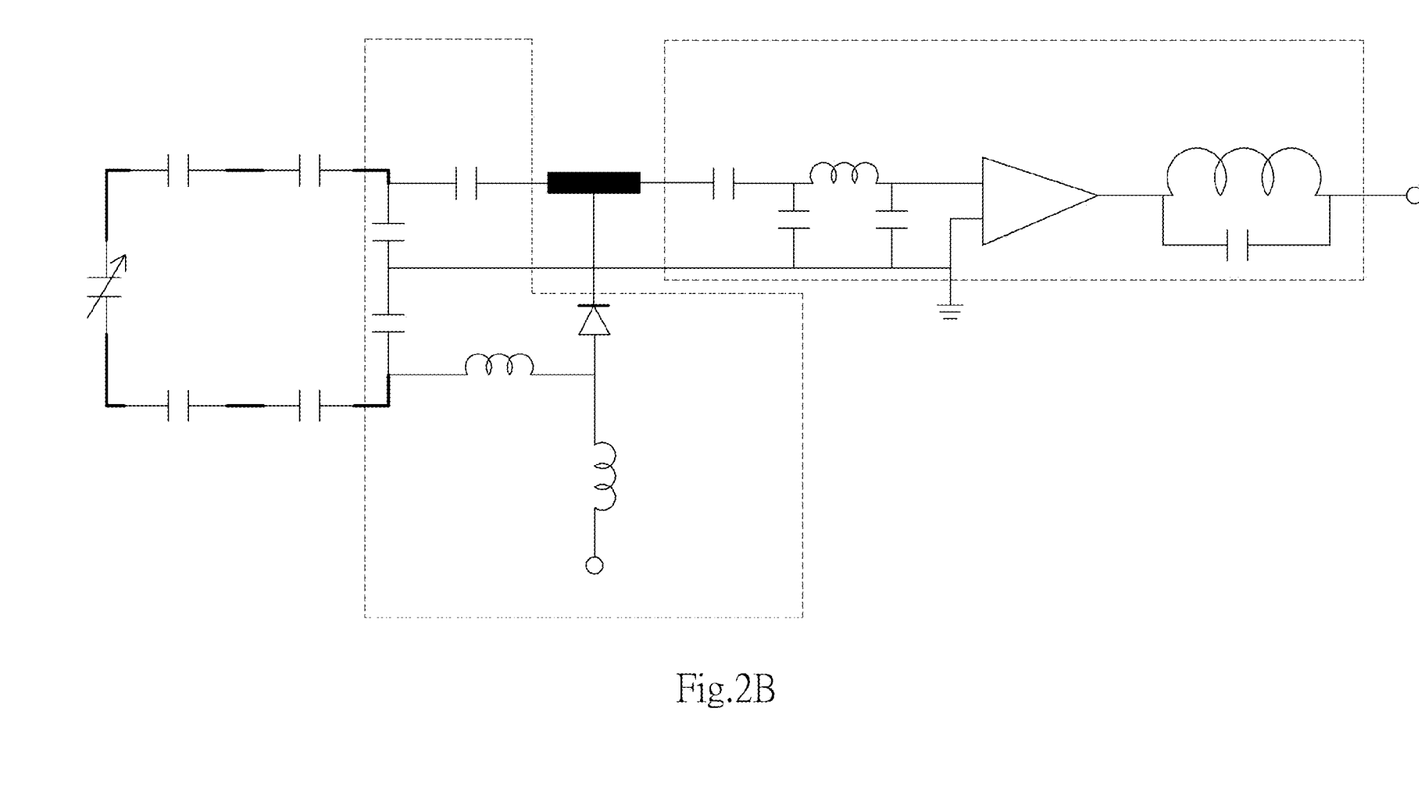
FIG. 2B shows the detailed circuit of the long RF coil.
Figure 3A:
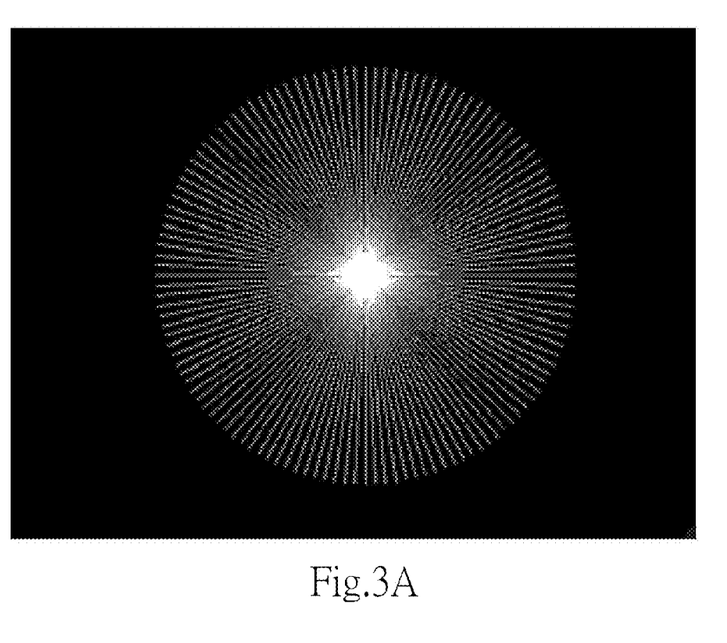
FIG. 3A shows the radial k-space trajectory for unaccelerated imaging in the first embodiment.
Figure 3B:
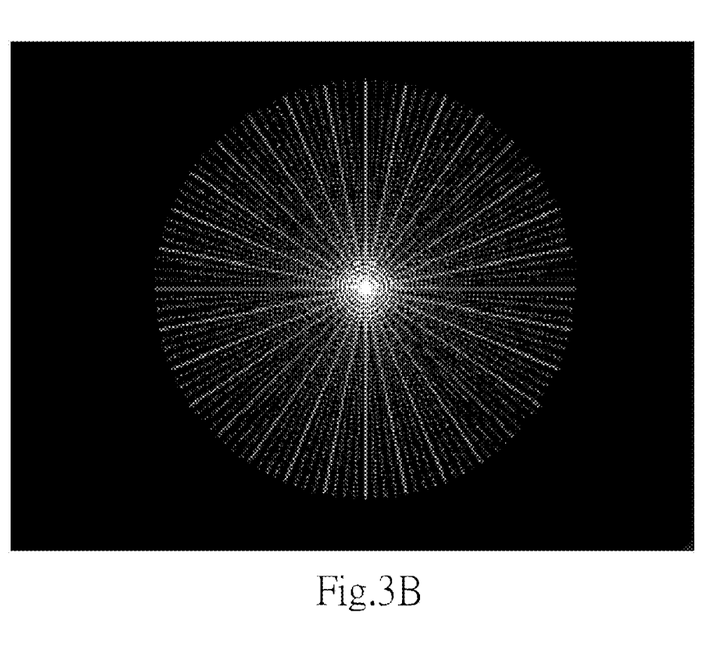
FIG. 3B shows the radial k-space trajectory for imaging with a 4-fold acceleration in the first embodiment.
Figure 3C:
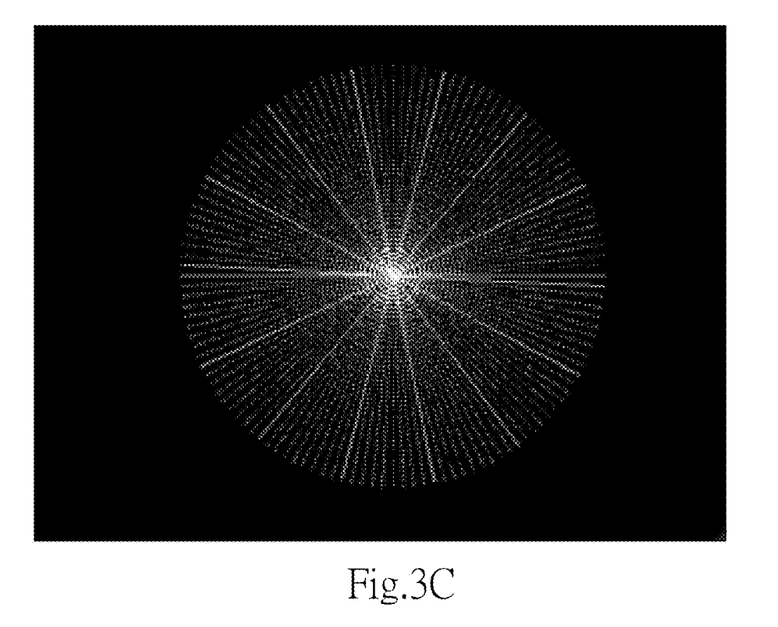
FIG. 3c shows the radial k-space trajectory for imaging with a 9-fold acceleration in the first embodiment.
Figure 3D:
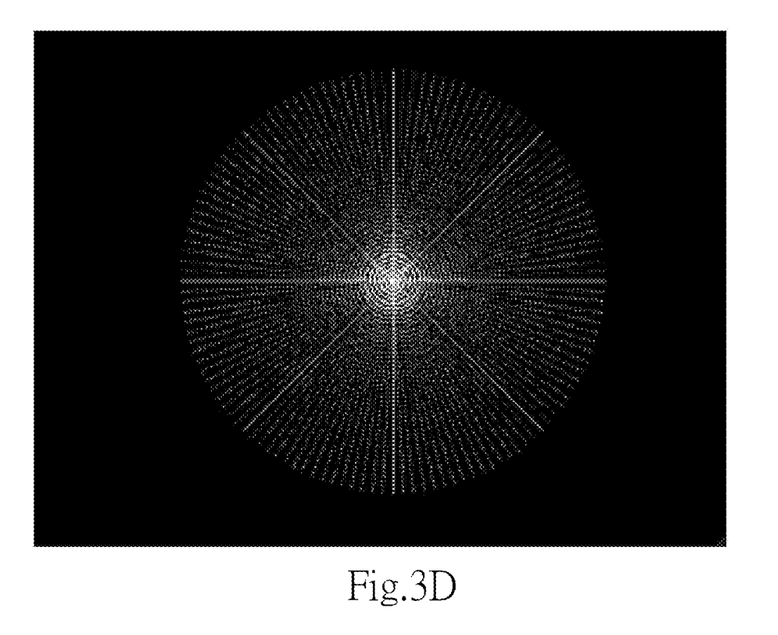
FIG. 3D shows the radial k-space trajectory for imaging with a 16-fold acceleration in the first embodiment.

The detailed circuit of the long RF coil is given in FIG. 2B; similarly, long RF coils are constructed using a balanced circuit design with six non-magnetic capacitors and one variable capacitor. A long RF coil consists of the coil, detuning network, matching network, preamplifier and the cable trap similar to that of a short RF coil. Two minor differences between long and short RF coils are i) two more capacitors and ii) one more π-network matching circuit, due to different coil input impedances.

Though the neighboring RF coils are decoupled by overlapping, RF coils are closed to each other; therefore, the RF coil next to the nearest neighbor could still be coupled significantly. This challenge is mitigated by pre-amplifier decoupling. Because a matching network also behaves as a phase shifter, which transforms the low input impedance at the low noise pre-amplifier to the high impedance at the RF coil, the induced current flow on an RF coil due to coupling is thus minimized. Bent bridges are used to cross neighboring RF coils to avoid contact. In addition to the active detuning using a PIN diode, a fuse enduring up to 570 mA is serially integrated into the coil for the safety concern. All pre-amplifiers are arranged in parallel with Bo in order to avoid the Hall effect.

To compare the performance of a CS array with that of a SB array, the 32-channel CS coil array shown in FIG. 1 and the 32-channel commercial SB coil array described were used to image a transverse plane of a saline phantom. The SNR maps of the saline phantom images with acceleration rates R=4, 9, and 16 were calculated. The radial k-space trajectories used (256 shots for R=1 unaccelerated case, and R=4, 9, 16) are given in FIGS. 3A, 3B, 3C, and 3D respectively.

Figure 4A:
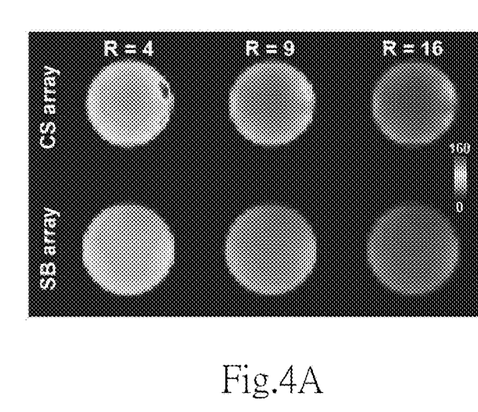
FIG. 4A shows the SNR maps of the MRI images of a saline phantom with acceleration rate R=4, 9, and 16 using both circularly symmetric (CS) and soccer ball (SB) coil array.

FIG. 4A shows the SNR maps from both arrays. Both arrays show higher SNR at the periphery of the FOV and lower SNR at the center of the FOA. A higher acceleration rate in general decreases the SNR. The SNR profiles through the center of the saline phantom are given in FIG. 4B. Table 1 lists the average, standard deviation, maximum, and minimum of the SNR at three acceleration rates using both arrays.

TABLE 1

Figure 4B:
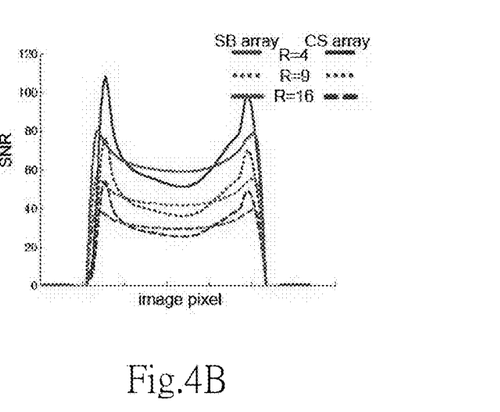
FIG. 4B shows the SNR profiles through the center of the field of view (FOV) from the MRI images of a saline phantom with acceleration rate R=4, 9, and 16 using both CS and SB coil array.

|  |  | Average | Standard deviation | Maximum | minimum |
|---|---|---|---|---|---|
| R = 4 | CS array | 69.2 | 14.0 | 158.1 | 51.1 |
|  | SB array | 63.4 | 5.9 | 87.8 | 51.6 |
| R = 9 | CS array | 49 | 9.9 | 111.8 | 36.1 |
|  | SB array | 44.8 | 4.2 | 62.1 | 36.5 |
| R = 16 | CS array | 34.6 | 7.0 | 79.0 | 25.5 |
|  | SB array | 31.7 | 2.9 | 43.9 | 25.8 |

Comparing the two arrays, it is found that the CS array has a higher SNR than the SB array at the same acceleration rate. This is further depicted by the SNR profile through the center of the saline phantom; these SNR profiles are found similar to those in unaccelerated cases. At the same acceleration rate, the SNR of the CS array is about 125% and 90% of the SB array at the periphery and the center of the FOV respectively. At regions out of the central circular area with a 4-cm diameter, the CS array has a higher SNR than the SB array for all cases where R=4, 9 and 16.

Figure 5A:
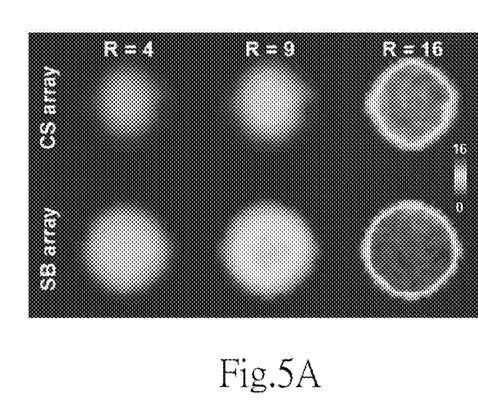
FIG. 5A shows the g-factor maps of the MRI images of a saline phantom with acceleration rate R=4, 9, and 16 using both CS and SB coil array.

The g-factor maps of R=4, 9, and 16 using both arrays are given in FIG. 5A. The g-factor profiles through the center of the saline phantom are given in FIG. 5B. Table 2 lists the average, standard deviation, maximum, and minimum of the g-factor at three acceleration rates using both arrays. Generally, at the same acceleration rate, the CS array has a smaller g-factor across the whole FOV, indicating the noise amplification during reconstruction with data acquired by the CS array is lower than that with data acquired by the SB array.

TABLE 2

Figure 5B:
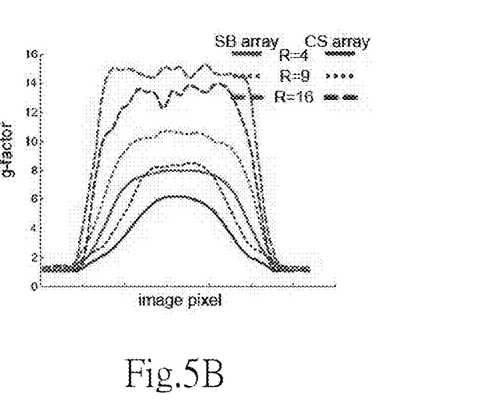
FIG. 5B shows the g-factor profiles through the center of the FOV from the MRI images of a saline phantom with acceleration rate R=4, 9, and 16 using both CS and SB coil array.

|  |  | Average | Standard deviation | Maximum | minimum |
|---|---|---|---|---|---|
| R = 4 | CS array | 4.2 | 1.2 | 6.2 | 1.8 |
|  | SB array | 6.9 | 1.1 | 8.2 | 3.8 |
| R = 9 | CS array | 6.0 | 1.7 | 8.6 | 2.4 |
|  | SB array | 9.5 | 1.2 | 11.1 | 5.7 |
| R = 16 | CS array | 12.9 | 1.1 | 15.2 | 7.8 |
|  | SB array | 14.8 | 0.8 | 16.5 | 11.7 |

Figure 6:
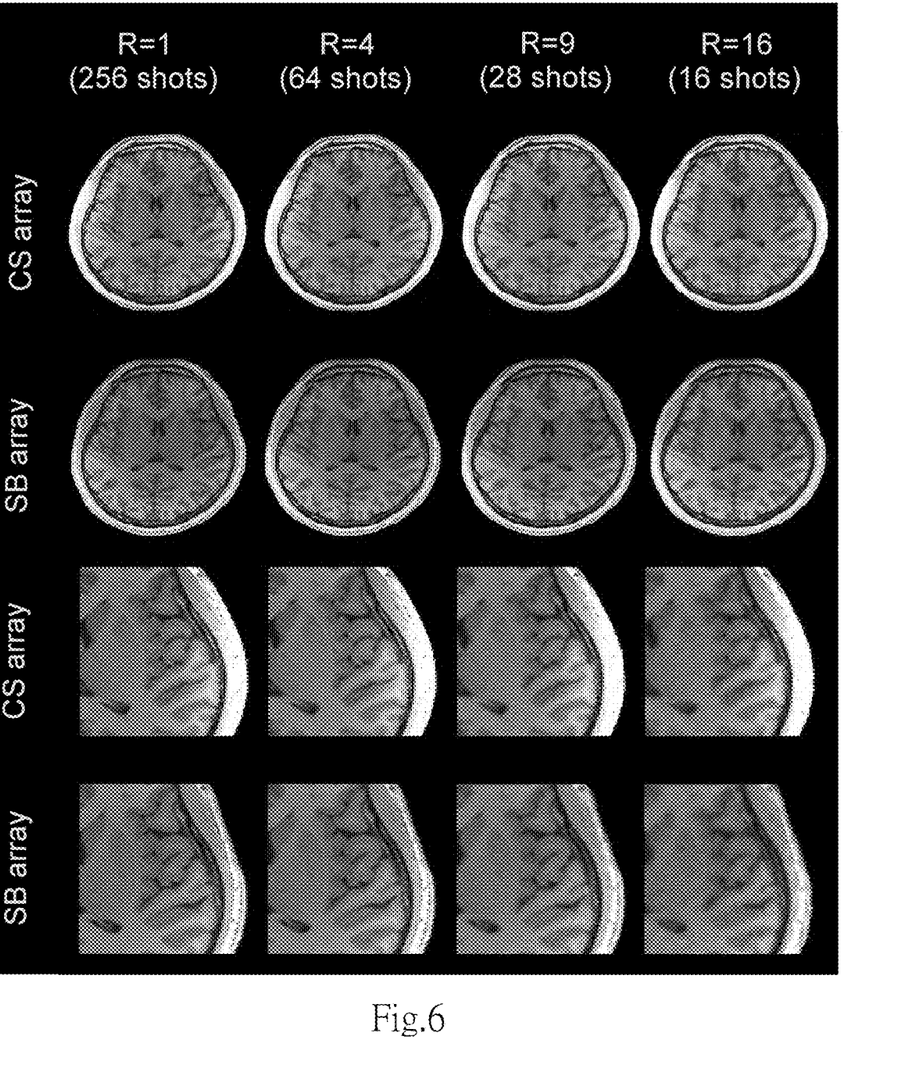
FIG. 6 shows the reconstructed images using radial k-space trajectories with R=1, 4, 9, and 16 for both the CS and SB arrays. The right temporal lobe is magnified in the lower panels to show details of the gray and white matter as well as deep brain structures.

To test the performance of the CS array in experiments, image data of a transverse slice of a human brain were acquired by both of the CS array and the SB array. FIG. 6 shows the reconstructed images using the radial k-space trajectories given in FIGS. 3A-3D (R=1, 4, 9, and 16). In cases where R=1 and R=4, both arrays give visually similar images with good gray/white matter contrast. However, in cases where R=9 and R=16, the gray and white matter at the temporal lobe become difficult to be discerned using the SB array, while the images from the CS array still show good contrast. Although the SNR calculation indicates that the CS array has a lower SNR at the center of the FOV, it is found that the deeper brain areas, such as thalamus and putamen, images are visually comparable with R=1, 4, 9, or 16.

Figure 7:
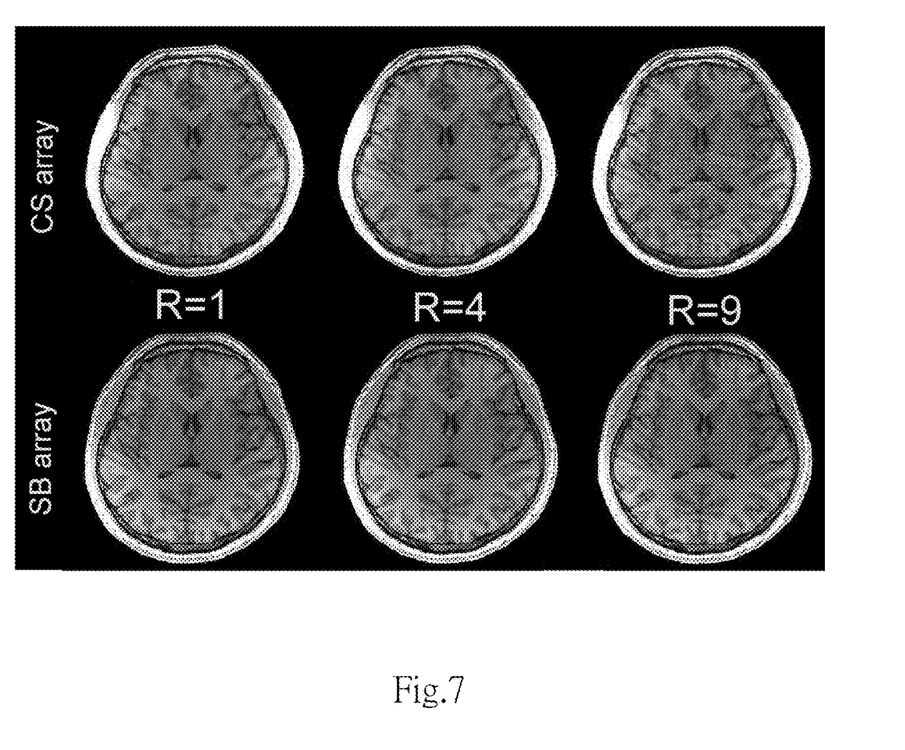
FIG. 7 shows the reconstructed images using Cartesian k-space trajectories with R=1, 4, and 9 for both the CS and SB arrays.

FIG. 7 shows the reconstructed images using Cartesian k-space trajectories (R=1, 4, and 9). We found that when a Cartesian k-space trajectory was used, at the same acceleration rate, the image reconstructed from image data acquired by the CS array is worse than that by the SB array, and the inferiority becomes more evident with a higher acceleration rate. T Taken together, these experiment results imply when a radial k-space trajectory is used, the image data acquired by the CS (circularly symmetric) array possess better spatial encoding efficiency; therefore, a higher acceleration rate could be acceptable. However, when an unsuitable k-space trajectory (such as the Cartesian trajectory) is selected for the CS array, this superiority disappears. In summary, for optimal performance, the coil array design should take the slice orientation, and the phase/partition encoding directions of a k-space trajectory into consideration.

What is claimed is:

1. A multi-channel coil array distributed over a helmet and configured for magnetic resonance imaging data acquisition, wherein the helmet has a vertex defining an axis passing therethrough and a perimeter inferior to the vertex, the multi-channel coil array comprising:

a plurality of coil elements distributed over the helmet, each coil element extending from the vertex toward the perimeter and arranged symmetrically with respect to said axis, wherein the plurality of coil elements include a set of first coils and a set of second coils, each of the second coils having a length extending from said vertex toward said perimeter that is shorter than a length extending from said vertex toward said perimeter of each of the first coils, wherein the plurality of coil elements are uniformly distributed over a plane defined by magnetic resonance encoding directions, that are not in parallel with frequency encoding directions, of a static magnetic field variation, generated by a plurality of gradient coils of a magnetic resonance imaging system, during a magnetic resonance data acquisition, and whereby the plurality of coil elements uniformly distributed over the plane, are arranged in order to cover a sample from which a magnetic resonance imaging data acquisition is obtainable.

2. The multi-channel coil array according to claim 1, wherein the plurality of coil elements are attached to a substrate.

3. The multi-channel coil array according to claim 1, wherein the plurality of the coil elements is arranged in circular symmetry with respect to the vertex.

4. The multi-channel coil array according to claim 1, wherein each of the coil elements is curved in order to fit the helmet along the length from said vertex toward said perimeter.

5. The multi-channel coil array according to claim 1, wherein two neighboring coil elements of the plurality of coil elements are overlapped in a lateral direction.

6. The multi-channel coil array according to claim 1, wherein the plurality of coil elements have the shape of irregular quadrilaterals.

7. The multi-channel coil array according to claim 1, wherein each of the coil elements is arranged in consideration of the slice orientation, in addition to phase/partition encoding directions of a k-space trajectory in the magnetic resonance data acquisition.

8. A multi-channel coil array distributed over a helmet and configured for magnetic resonance imaging data acquisition, wherein the helmet has a vertex defining an axis passing therethrough and a perimeter inferior to the vertex, the multi-channel coil array comprising:

a plurality of coil elements distributed over the helmet, each coil element extending from the vertex toward the perimeter and arranged symmetrically with respect to said axis, wherein the plurality of coil elements include a set of first coils and a set of second coils, each of the second coils having a length extending from said vertex toward said perimeter that is shorter than a length extending from said vertex toward said perimeter of each of the first coils, and wherein the plurality of coil elements are uniformly distributed over a curve defined by magnetic resonance encoding directions, that are not in parallel with frequency encoding directions of a static magnetic field variation generated by a plurality of gradient coils of a magnetic resonance imaging system, during a magnetic resonance data acquisition, and whereby the plurality of coil elements uniformly distributed over the curve, are arranged in order to cover a sample from which a magnetic resonance imaging data acquisition is obtainable.

9. The multi-channel coil array according to claim 8, wherein the plurality of coil elements are attached to a substrate.

10. The multi-channel coil array according to claim 8, wherein each of the coil elements is curved in order to fit the helmet along the length from said vertex toward said perimeter.

11. The multi-channel coil array according to claim 8, wherein the plurality of coil elements have the shape of irregular quadrilaterals.

12. The multi-channel coil array according to claim 8, wherein each of the coil elements is arranged in consideration of the slice orientation, in addition to phase/partition encoding directions of a k-space trajectory in the magnetic resonance data acquisition.

\* \* \* \* \*